United States Patent
Cheng

(10) Patent No.: US 7,491,073 B2
(45) Date of Patent: Feb. 17, 2009

(54) ELECTRICAL CARD CONNECTOR HAVING EJECTING MECHANISM WITH A STOPPING PLATE

(75) Inventor: Yung-Chang Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/974,051

(22) Filed: Oct. 11, 2007

(65) Prior Publication Data

US 2008/0090458 A1 Apr. 17, 2008

(30) Foreign Application Priority Data

Oct. 11, 2006 (TW) .............................. 95217919 U

(51) Int. Cl.
*H01R 13/62* (2006.01)
(52) U.S. Cl. ...................................... 439/159; 439/160
(58) Field of Classification Search .................. 439/159, 439/160
See application file for complete search history.

(56) References Cited

U.S. PATENT DOCUMENTS

| 6,109,941 A * | 8/2000 | Koseki et al. ................ 439/159 |
| 6,123,560 A * | 9/2000 | Hara et al. ................... 439/159 |
| 6,142,801 A * | 11/2000 | Koseki et al. ................ 439/159 |
| 6,162,075 A * | 12/2000 | Hara et al. ................... 439/159 |
| 6,652,301 B2 * | 11/2003 | Harasawa et al. ........... 439/159 |
| 6,796,816 B2 * | 9/2004 | He .............................. 439/159 |
| 6,857,886 B2 * | 2/2005 | Lai et al. ..................... 439/159 |
| 6,962,500 B1 | 11/2005 | Chen |
| 7,192,292 B1 * | 3/2007 | Su .............................. 439/159 |
| 2007/0141879 A1 * | 6/2007 | Wu ............................. 439/159 |

FOREIGN PATENT DOCUMENTS

| TW | 314665 | 9/1997 |
| TW | 325154 | 1/1998 |

* cited by examiner

*Primary Examiner*—Hae Moon Hyeon
(74) *Attorney, Agent, or Firm*—Wei Te Chung

(57) ABSTRACT

An electrical card connector (1) for receiving a card, includes an insulative housing (4), a shield (2) with an end mounted on the insulative housing and another end defining an inserting opening (10) for the card inserting, and an ejecting mechanism (5) assembled on a lateral side of the shield. The ejecting mechanism comprises a lever mechanism (51) for ejecting the card, and a pushing mechanism (52) connecting with the lever mechanism. The pushing mechanism includes a pushing bar (523), a base (521) with a track (5211) mating with the pushing bar, a slider (522) movably received in the pushing bar and the track of the base, and a stopping plate (525) mounted adjacent to the pushing bar with a beam (5251) resisting on the pushing bar and capable of separating from the pushing bar by the lever mechanism.

19 Claims, 7 Drawing Sheets

ELECTRICAL CARD CONNECTOR HAVING EJECTING MECHANISM WITH A STOPPING PLATE

BACKGROUND OF THE INVENTION

1. Field of the Invention

The present invention generally relates to an electrical card connector, and more particularly to an electrical card connector having an ejecting mechanism.

2. Description of Prior Art

Modern times, the PC card is always used as an external equipment for increase the storage of the electrical consumer products, like Mobile phone, Digital camera, etc. The electrical card connector is used for electrically connecting the PC card and the electrical consumer products. An ejecting mechanism is used on the card connector for ejecting the card from the card connector.

TW. Pat. No. 325154 and TW. Pat. No. 314665 disclose a kind of nonage ejecting mechanism. The user just presses a knob one time to ejecting the card from the ejecting member. However, this kind of ejecting mechanism has a long part beyond the electrical card connector when the card is inserted into the electrical card connector. Therefore, the ejecting mechanism is easily broken when an improper force working on the part beyond the electrical card connector.

Another kind of ejecting mechanism is appeared for resolving this problem. U.S. Pat. No. 6,962,500 discloses another kind of ejecting mechanism, when the card in the electrical connector, the ejecting mechanism is not beyond the electrical connector except a knob. When ejecting the card, the user need to press the ejecting mechanism twice. Referring to FIG. 7, an electrical card connector has an ejecting member as mentioned-above is shown. The ejecting member 6 comprises a pushing pole 610, a base plate 611, a slider 612, a connecting pole 620 and an ejecting member (not shown). When the pushing pole 610 moving, the slider 612 moves subject to the pushing pole 610 along a heart-shaped track 6110 of the base plate 611 and resists on an engaging part 6200 of the connecting pole 620 to ejecting the card. However, when a card is not inserted into the card connector, the pushing pole 610 still has a possibility to beyond the card connector. Accordingly, the ejecting mechanism is easily broken when an improper force working on the part beyond the electrical card connector.

Hence, it is desirable to have an improved card connector to overcome the above-mentioned disadvantages of the prior art.

BRIEF SUMMARY OF THE INVENTION

Accordingly, the object of the present invention is to provide an electrical card connector having an ejecting mechanism, which is always not beyond the electrical card connector to avoid broken from an improper force.

In order to achieve the above-mentioned object, an electrical card connector for receiving a card, includes an insulative housing, a shield with an end mounted on the insulative housing and another end defining an inserting opening for the card inserting, and an ejecting mechanism assembled on a lateral side of the shield. The ejecting mechanism comprises a lever mechanism for ejecting the card, and a pushing mechanism connecting with the lever mechanism. The pushing mechanism includes a pushing bar, a base with a track mating with the pushing bar, a slider movably received in the pushing bar and the track of the base, and a stopping plate mounted adjacent to the pushing bar with a beam resisting on the pushing bar and capable of separating from the pushing bar by the lever mechanism.

Other objects, advantages and novel features of the invention will become more apparent from the following detailed description of the present embodiment when taken in conjunction with the accompanying drawings.

DETAILED DESCRIPTION OF THE INVENTION

Figure 1:
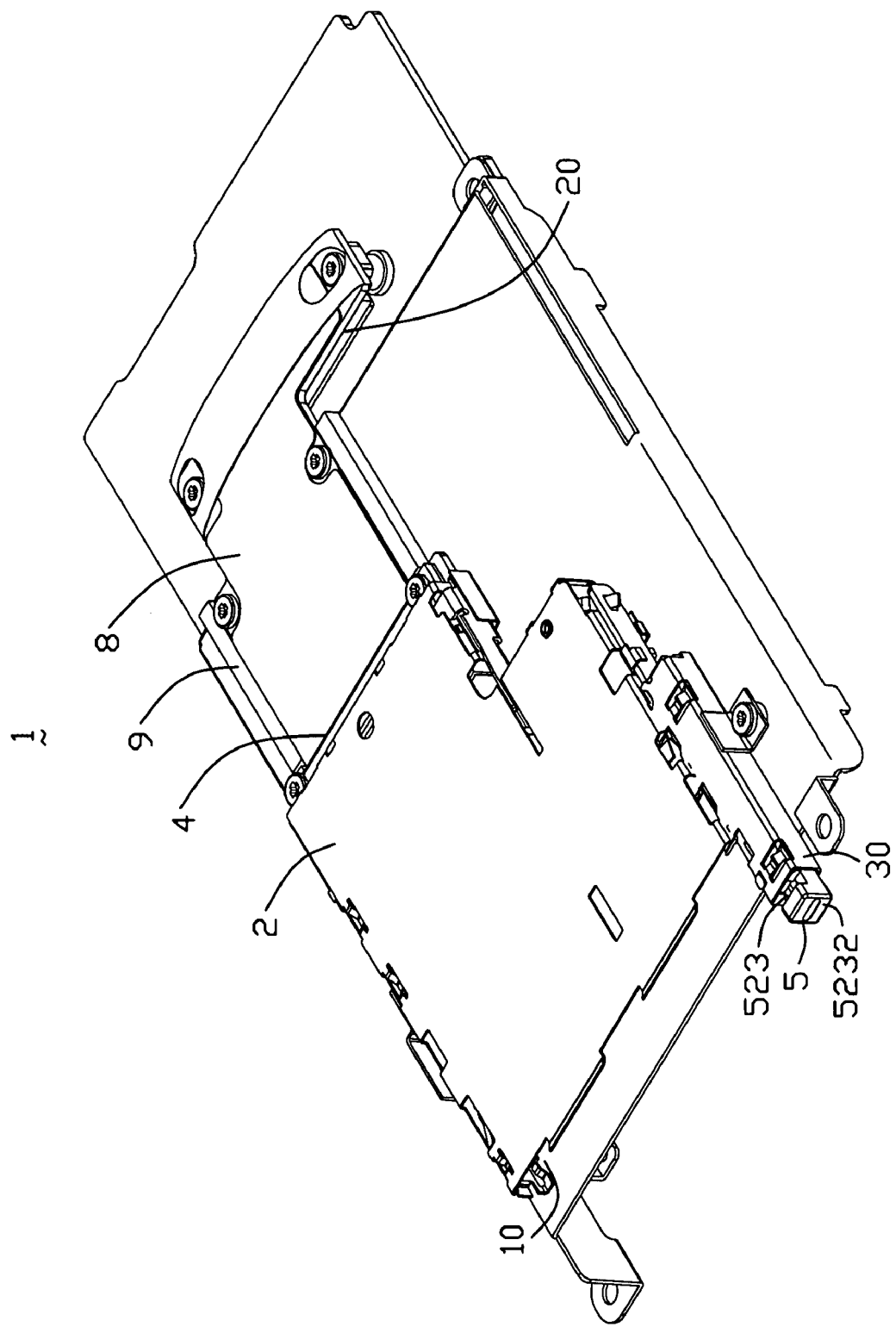
FIG. 1 is a perspective view of an electrical card connector in accordance with the present invention.
Figure 2:
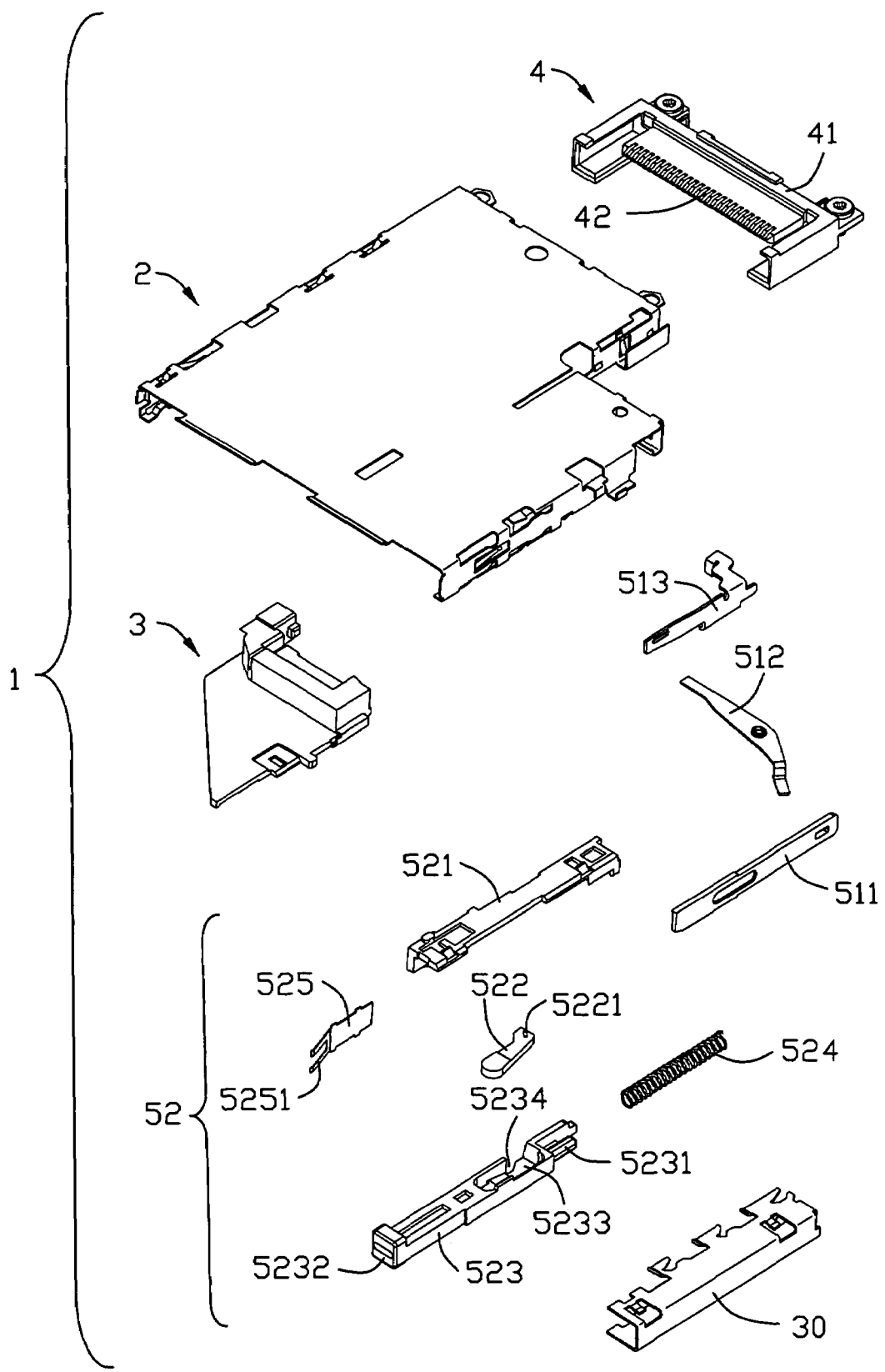
FIG. 2 is an exploded, perspective view of the card connector shown in FIG. 1.

Reference will now be made to the drawing figures to describe the present invention in detail.

Referring to FIG. 1 to FIG. 4, an electrical card connector 1 in accordance with the present invention comprises a shield 2, a guiding member 3, an insulaitive housing 4 and an ejecting mechanism 5. The shield 2, made of metallic plate, has one end mounted on the insulative housing 4 and another end defining an inserting opening 10 provided for a card inserting. The guiding member 3 is placed in the shield 2 for guiding the card till a right position. In present embodiment, the electrical card connector 1 electrically connects with a Flexible Printed Circuit (FPC) 8, and is mounted on a base plate 9. The FPC 8 electrically connects to a board to board connector 20 at the end opposite to the electrical card connector 1.

The insulative housing comprises a main body 41 and a contacting portion 42 extending from the main body 41. A plurality of terminals (not labeled) are located in the main body 41 and the contacting portion 42 of the insulative housing for electrically connecting with the card.

The ejecting mechanism 5 comprises a lever mechanism 51 and a pushing mechanism 52 assembled with the lever mechanism 51. The ejecting mechanism 5 is assembled on a lateral side of the shield 2 by a retaining frame 30 locking with the shield 2. The lever mechanism 51 comprises a connecting pole 511, an ejecting member 513 and a lever member 512 connecting the connecting pole 511 and the ejecting member 513. The pushing mechanism comprises a base 521, a slider 522, a pushing bar 523, a spring member 524 and a stopping plate 525. The connecting pole 511 is sandwiched by the pushing bar 523 and the stopping plate 525.

The base 521 and the pushing bar 523, respectively, is configured of strip and are matched with each other. The base 521 defines a heart-shaped track 5211 thereon. The heart-shaped track comprises two straight slots with different length, two slant slots, respectively, extending from the straight and communicating with each other, and an incline slot communicating two straight slots opposite to the slant slots. We name four positions of the track as A, B, C and D. The position C is an original position of the longer straight slot; the position D is an end of the longer straight slot, the position A is the place of two slant slots joining; the position B is an end of a short straight slot. The pushing bar 523 comprises post 5231 and a knob 5232 opposite to the post 5231. The spring member 524 is mounted on the post 5231. The pushing bar 523 defines a receiving slot 5233, and the slider 522 is partially and movably received in the receiving slot 5233. The slider 522 forms a rib 5221 movably received in the heart track 5211 of the base 521.

The pushing bar 523 forms a stopping portion 5234 at a lateral side thereof. The stopping plate 525 comprises a panel (not labeled) and a beam 5251 extending slantly from the panel, and the beam defines a cutout (not labeled). During assembled, the stopping plate 525 is placed adjacent to the pushing bar 523 with the beam 5251 attached the pushing bar 523, and the cutout allows a part of the slider 522 to pass through. After assembled, the beam 5251 resists the stopping portion 5234.

Figure 3:
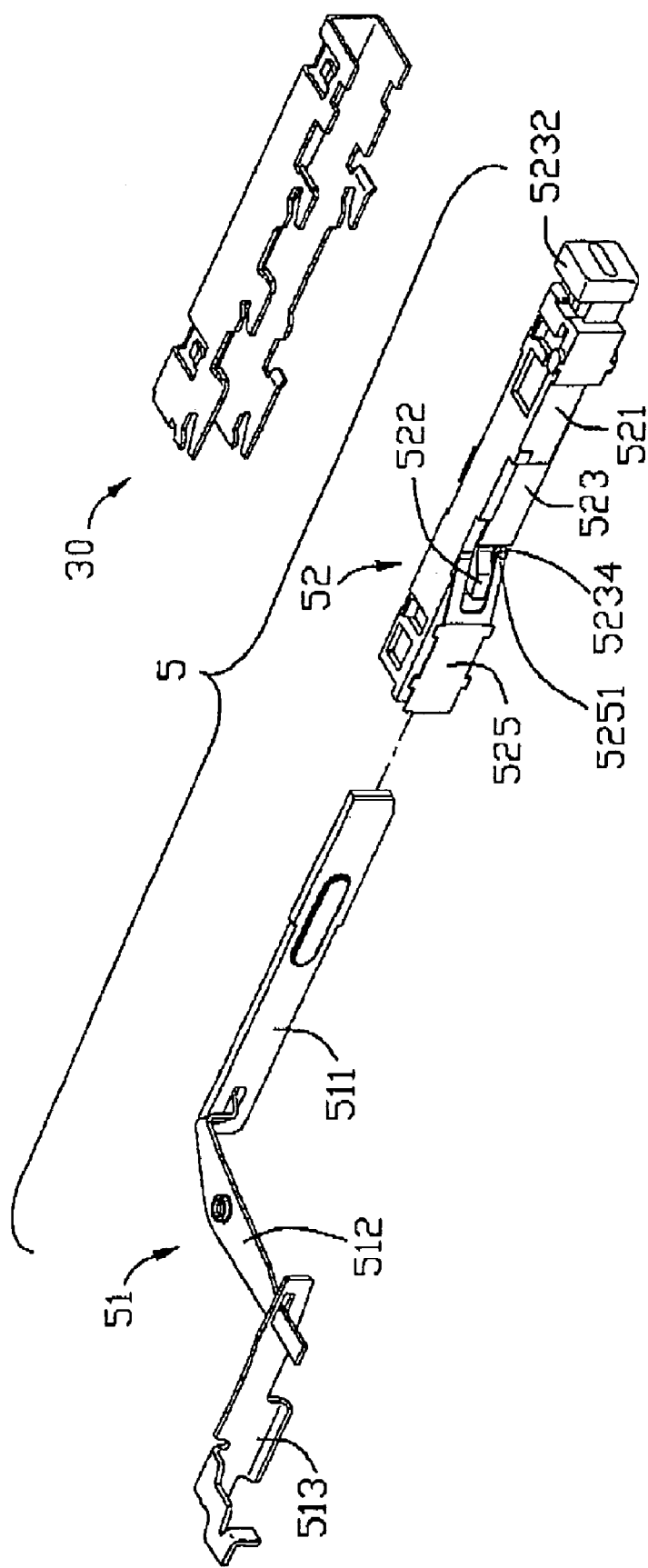
FIG. 3 is a view of an ejecting mechanism and a retaining frame of the electrical card connector shown in FIG. 1.
Figure 4:
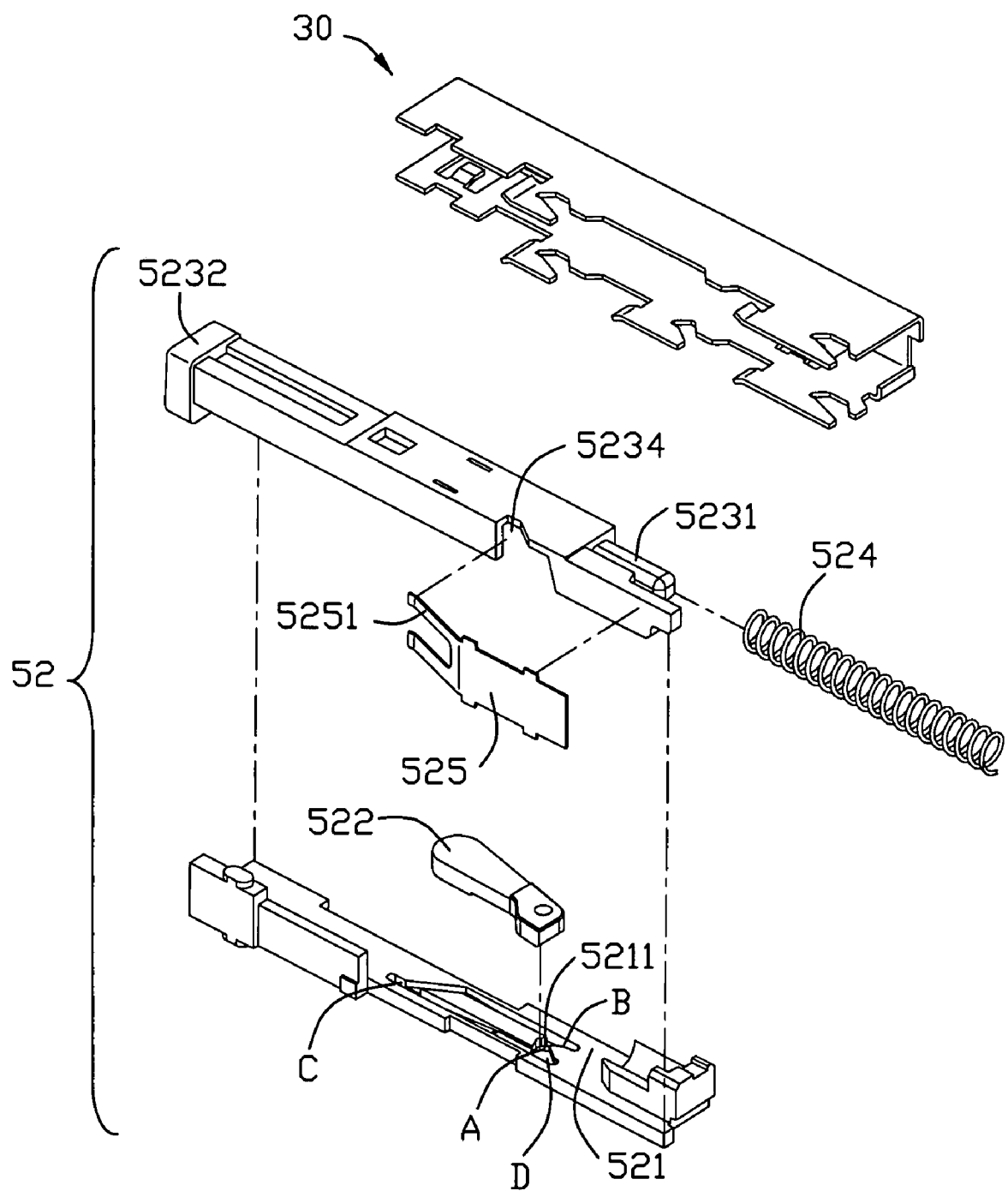
FIG. 4 is an exploded, perspective view of the ejecting mechanism and the retaining frame shown in FIG. 3.
Figure 5:
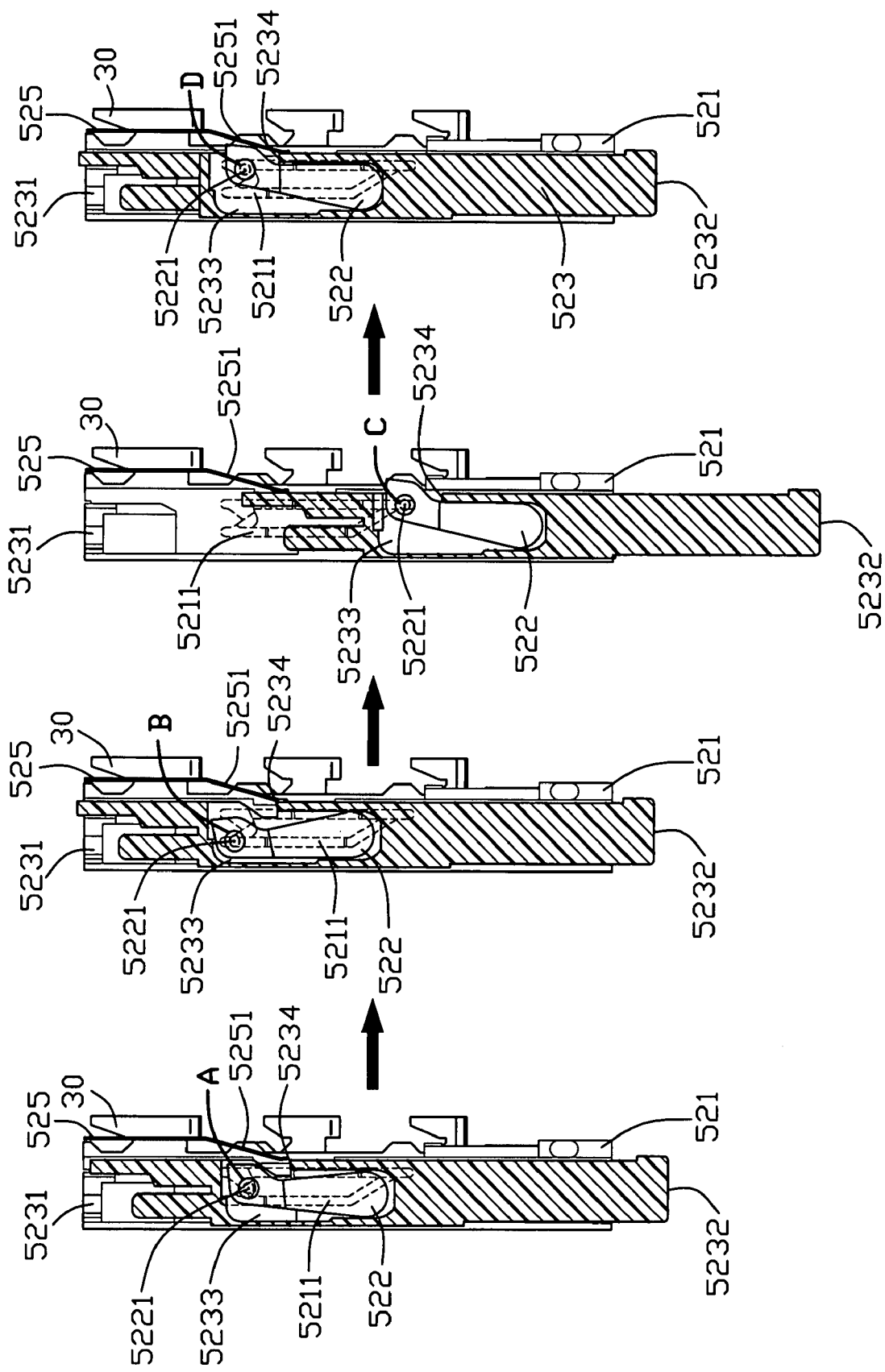
FIG. 5 is a view to show a slider's moving process in a track of the ejecting mechanism.
Figure 6:
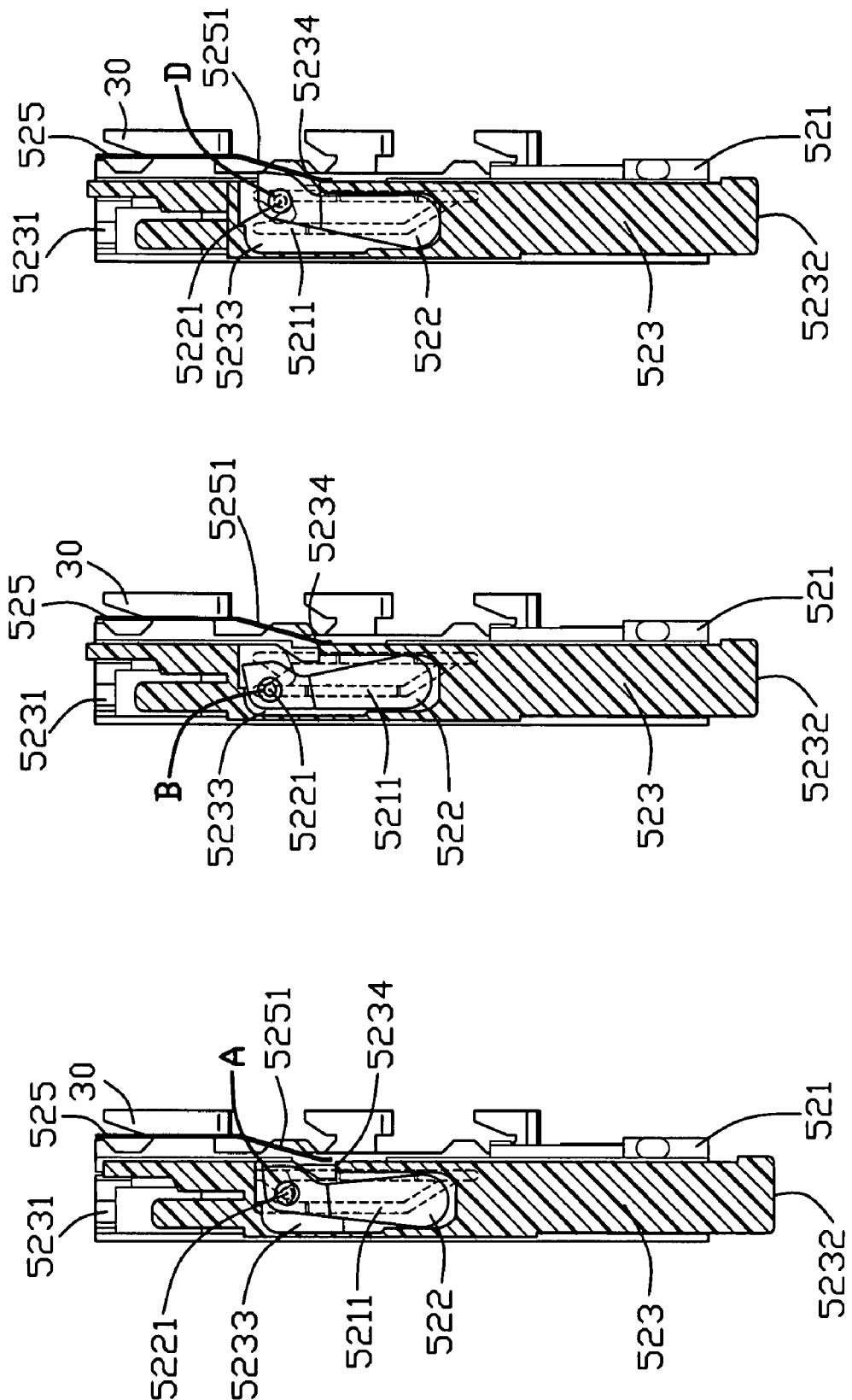
FIG. 6 is another view to show a slider's moving process in a track of the ejecting mechanism.
Figure 7:
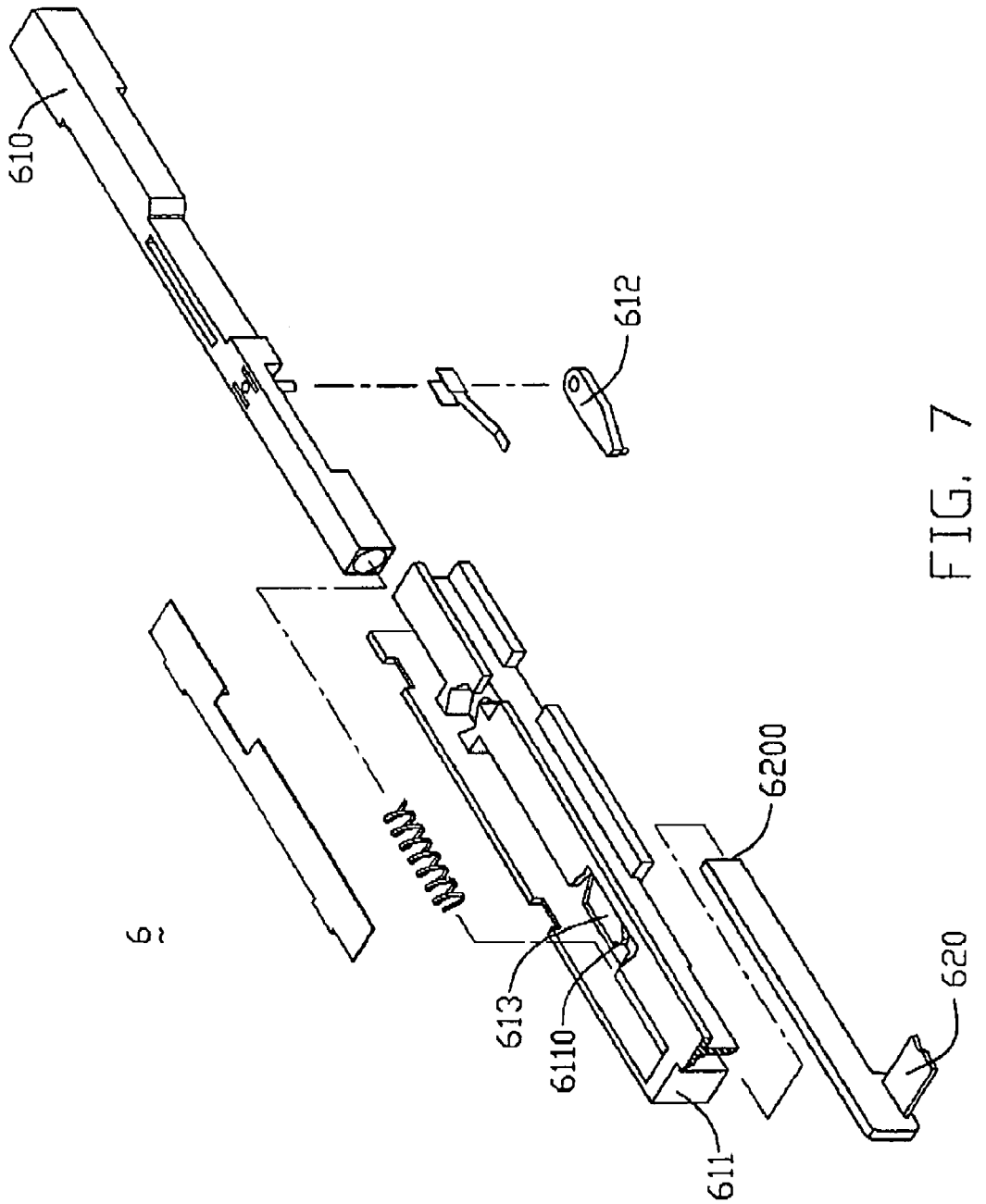
FIG. 7 is a view to show a prior art.

Referring to FIG. 3, FIG. 5 and FIG. 6, when the card is not inserted in to the inserting opening 10 of the electrical card connector 1, only the knob 5232 of the pushing bar 523 is beyond the electrical card connector 1 provided for user to pressing. The rib 5221 of slider 522 is on the A position, and the beam 5251 of the stopping plate 525 resists on the stopping portion 5234 of the pushing bar 523. Thereby, even though the user presses the knob 5232, the pushing bar 523 can not move along the front-to-back direction cause of the beam 5251 resisting on the stopping plate 525. Accordingly, the pushing bar 523 keeps itself not beyond the electrical card connector 1 except knob 5232. The rib 5221 of slider 522 is at the D position.

When the card is inserted into the inserting opening 10 of the electrical card connector 1 along the front-to-back direction, the card pushing the ejecting member 513, and then the ejecting member 513 pushing the connecting pole 511 through the lever member 512, the connecting pole 511 moves along a direction opposite to the front-to-back direction till the connecting pole 511 engaging with the stopping plate 525 to separate the beam 5251 from the stopping portion 5234 of the pushing bar 523. The pushing bar 523 is still not beyond the electrical card connector 1 except knob 5232. When the card is inserted to a right position, the rib 5221 of the slider 522 moves from the D position to the A position.

When ejecting the card from the electrical card connector 1, the user presses the knob 5232, the pushing bar 523 moves along the front-to-back direction. The rib 5221 of the slider moves from the A position to the B position, and then to the C position cause of the resilient force of the spring member 524 and as the rib 5221 of the slider 522 moves from the B position to the C position, the slider 522 passed through the cutout of the stop plate 525. Now, the pushing bar 523 has a long portion beyond the electrical card connector 1. The user presses the knob 5232 again, the pushing bar 523 pushing the slider 522, the slider 522 pushing the connecting pole 511 along the front-to-back direction with the rib 5221 moving from the C position to the D position, and then the connecting pole 511 pushing the ejecting member 513 through the lever member 512 to ejecting the card. The pushing bar 523 resumes to the station when the card is not inserted into the inserting opening 10. The beam 5251 of the stopping plate 525 resists the stopping portion 5234 again.

Because the existing of the stopping plate 525, when the card is not inserted into the electrical card connector 1, the pushing bar 523 is not beyond the electrical card connector 1 all the time except the knob 5232.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical card connector for receiving a card, comprising:
    an insulative housing;
    a shield comprising an end mounted on the insulative housing and another end defining an inserting opening for the card inserting; and
    an ejecting mechanism assembled on a lateral side of the shield, comprising:
    a lever mechanism for ejecting the card; and
    a pushing mechanism connecting with the lever mechanism, comprising a pushing bar, a base with a track mating with the pushing bar, a slider movably received in the pushing bar and the track of the base, a spring member mounted on the pushing bar, and a stopping plate mounted adjacent to the pushing bar with a beam resisting on the pushing bar and capable of separating from the pushing bar by the lever mechanism, and the beam defining a cutout to allow the slider to pass through.

2. The electrical card connector as claimed in claim 1, wherein the pushing bar forms a stopping portion at a lateral side thereof, said stopping plate resisting on the stopping portion.

3. The electrical card connector as claimed in claim 1, wherein the slider forms a rib movably received in the track of the base.

4. The electrical card connector as claimed in claim 1, wherein the track is configured of a heart.

5. The electrical card connector as claimed in claim 1, wherein the pushing bar defines a receiving slot, said slider is partially and movably received in the receiving slot.

6. The electrical card connector as claimed in claim 1, wherein the pushing bar forms a post, said spring member is mounted on the post.

7. The electrical card connector as claimed in claim 6, wherein the pushing bar forms a knob opposite to the post for a user pressing.

8. The electrical card connector as claimed in claim 1, further comprising a retaining frame, the ejecting mechanism is retained on the shield by the retaining frame retained on the shield.

9. The electrical card connector as claimed in claim 1, wherein the lever mechanism comprises a connecting pole, an ejecting plate and a lever member connecting the connecting pole and the ejecting plate.

10. The electrical card connector as claimed in claim 9, wherein the connecting pole is sandwiched by the pushing bar and the stopping plate and capable of resisting on stopping plate to space the beam of the stopping plate and the pushing bar apart.

11. An ejecting mechanism used on a electrical card connector, comprising:
    a lever mechanism comprising a connecting pole, an ejecting plate and a lever member connecting the connecting pole and the ejecting plate; and
    a pushing mechanism assembled on the lever mechanism, comprising a pushing bar, a base with a track mating with the pushing bar, a slider movably received in the pushing bar and the track of the base, a spring member mounted on the pushing bar, and a stopping plate mounted adjacent to the pushing bar with a beam resisting on the pushing bar and capable of separating from the pushing bar by the connecting pole resisting on, and the beam defining a cutout to allow the slider to pass through.

12. The electrical card connector as claimed in claim 11, wherein the track is configured of a heart, and comprises two straight slots with different length, two slant slots, respectively, extending from the straight and communicating with each other, and an incline slot communicating two straight slots opposite to the slant slots.

13. The electrical card connector as claimed in claim 11, wherein the slider forms a rib movably received in the track of the base.

14. The electrical card connector as claimed in claim 11, wherein the pushing mechanism further comprises a post, said spring member is mounted on the post.

15. The electrical card connector as claimed in claim 11, further comprising a knob.

16. An electrical card connector comprising:
  an insulative housing with a plurality of contacts;
  a card receiving space beside said housing, into which a contacting section for each other said contacts extends;
  an ejecting mechanism located beside said card receiving space adapted to be actuated by a card inserted into the card receiving space;
  said ejecting mechanism including:
  a lever mechanism and pushing mechanism discrete from each other,
  said lever member having a first section invading the card receiving space for mutual actuation with the inserted card; and
  said pushing mechanism including a base defining a heart-like track, a slider moving along said tack, and pushing bar reciprocally moveable along a front-to-back direction with the slider moving along the heart like track, said lever mechanism further having second section, which is reciprocally moveable along said front-to-back direction, for mutual actuation with pushing member; and a stopper located around the pushing bar, and the stopper defining a cutout to allow the slider to pass through; wherein
  when said second section of the lever mechanism and said pushing bar are mutually located in a relatively closer manner in said front-to-back direction, the pushing bar is allowed to move forwardly by reason of the stopper no longer obstructing the pushing bar; when said second section of the lever mechanism and said pushing bar are mutually located in a relatively farther manner in said front-to-back direction, the pushing bar can not move forwardly by reason of the stopper obstructing pushing bar.

17. The electrical card connector as claimed in claim 16, wherein the stopper is actuated, by said second section of the lever mechanism, to move for not obstructing the pushing bar.

18. The electrical card connector as claimed in claim 17, wherein the inserted card is received in the card receiving space when said second section of the lever mechanism and said pushing bar are mutually located in the relative closer manner in said front-to-back direction.

19. The electrical card connector as claimed in claim 16, wherein no card is received in the card receiving space when said second section of the lever mechanism and said pushing bar are mutually bar are mutually located in the relative farther manner in said front-to-back direction.

* * * * *